(12) United States Patent
Kim

(10) Patent No.: US 11,309,384 B2
(45) Date of Patent: Apr. 19, 2022

(54) SUPER JUNCTION SEMICONDUCTOR DEVICE AND METHOD OF MANUFACTURING THE SAME

(71) Applicant: DB HITEK CO., LTD., Seoul (KR)

(72) Inventor: Young Seok Kim, Seongnam-si (KR)

(73) Assignee: DB HITEK CO., LTD., Seoul (KR)

(*) Notice: Subject to any disclaimer, the term of this patent is extended or adjusted under 35 U.S.C. 154(b) by 96 days.

(21) Appl. No.: 16/804,794

(22) Filed: Feb. 28, 2020

(65) Prior Publication Data
US 2020/0279911 A1 Sep. 3, 2020

(30) Foreign Application Priority Data
Feb. 28, 2019 (KR) .................. 10-2019-0024417

(51) Int. Cl.
| | |
|---|---|
| H01L 29/06 | (2006.01) |
| H01L 29/423 | (2006.01) |
| H01L 29/40 | (2006.01) |
| H01L 29/66 | (2006.01) |
| H01L 29/78 | (2006.01) |
| H01L 21/8234 | (2006.01) |

(52) U.S. Cl.
CPC .. *H01L 29/0634* (2013.01); *H01L 21/823487* (2013.01); *H01L 29/0657* (2013.01); *H01L 29/401* (2013.01); *H01L 29/4236* (2013.01); *H01L 29/66712* (2013.01); *H01L 29/7802* (2013.01); *H01L 29/7827* (2013.01)

(58) Field of Classification Search
CPC ............ H01L 29/7827; H01L 29/7802; H01L 29/66712; H01L 29/0657; H01L 29/0634; H01L 21/823487
See application file for complete search history.

(56) References Cited

U.S. PATENT DOCUMENTS

| | | | | |
|---|---|---|---|---|
| 6,551,909 B1* | 4/2003 | Fujihira | ............ | H01L 29/66333 438/510 |
| 6,611,021 B1* | 8/2003 | Onishi | ................ | H01L 29/0634 257/328 |
| 6,639,272 B2* | 10/2003 | Ahlers | ................ | H01L 29/0634 257/328 |
| 6,936,892 B2* | 8/2005 | Fujihira | .............. | H01L 29/0619 257/341 |
| 7,166,890 B2* | 1/2007 | Sridevan | ............ | H01L 29/7802 257/328 |
| 7,759,733 B2* | 7/2010 | Ono | .................... | H01L 29/0634 257/341 |
| 8,866,221 B2* | 10/2014 | Hirler | ................. | H01L 29/7395 257/339 |
| 9,972,713 B2* | 5/2018 | Eguchi | ................ | H01L 29/0634 |
| 10,644,102 B2* | 5/2020 | Padmanabhan | ..... | H01L 29/7813 |

(Continued)

*Primary Examiner* — Joseph C. Nicely
(74) *Attorney, Agent, or Firm* — Patterson Thuente Pedersen, P.A.

(57) ABSTRACT

A super junction semiconductor device includes a substrate having a first conductive type, a blocking layer positioned on the substrate, the blocking layer including first conductive type pillars and second conductive type pillars, each extending in a vertical direction and arranging alternatively in a horizontal direction, and a gate structure disposed on the blocking layer, the gate structure extending in the horizontal direction and being electrically connected to ones of the first and second conductive type pillars. Thus, oscillation phenomena may be suppressed.

14 Claims, 9 Drawing Sheets

(56) References Cited

U.S. PATENT DOCUMENTS

| | | | | |
|---|---|---|---|---|
| 2004/0108568 A1* | 6/2004 | Qu | H01L 29/7802 | |
| | | | 257/500 | |
| 2005/0042830 A1* | 2/2005 | Blanchard | H01L 29/66333 | |
| | | | 438/268 | |
| 2005/0045922 A1* | 3/2005 | Ahlers | H01L 27/0883 | |
| | | | 257/242 | |
| 2011/0233656 A1* | 9/2011 | Ohta | H01L 29/66712 | |
| | | | 257/329 | |
| 2012/0299094 A1* | 11/2012 | Lee | H01L 21/2253 | |
| | | | 257/341 | |
| 2013/0087851 A1* | 4/2013 | Kagata | H01L 29/7827 | |
| | | | 257/329 | |
| 2013/0140633 A1* | 6/2013 | Pattanayak | H01L 21/266 | |
| | | | 257/341 | |
| 2013/0307058 A1* | 11/2013 | Wahl | H01L 29/407 | |
| | | | 257/330 | |
| 2015/0333118 A1* | 11/2015 | Eguchi | H01L 21/265 | |
| | | | 257/493 | |
| 2015/0372132 A1* | 12/2015 | Pattanayak | H01L 21/2254 | |
| | | | 257/331 | |
| 2017/0054009 A1* | 2/2017 | Lee | H01L 29/1095 | |
| 2018/0006147 A1* | 1/2018 | Weber | H01L 21/26586 | |
| 2018/0261691 A1* | 9/2018 | Harrington, III | H01L 21/02016 | |
| 2018/0374919 A1* | 12/2018 | Tilke | H01L 21/31155 | |
| 2019/0189796 A1* | 6/2019 | Su | H01L 29/7806 | |
| 2019/0206988 A1* | 7/2019 | Padmanabhan | H01L 21/2253 | |
| 2019/0221644 A1* | 7/2019 | Hu | H01L 29/7813 | |
| 2019/0326431 A1* | 10/2019 | Yilmaz | H01L 29/66734 | |

\* cited by examiner

SUPER JUNCTION SEMICONDUCTOR DEVICE AND METHOD OF MANUFACTURING THE SAME

CROSS-REFERENCE TO RELATED APPLICATION

This application claims priority to Korean Patent Application No. 10-2019-0024417, filed on Feb. 28, 2019 and all the benefits accruing therefrom under 35 U.S.C. § 119, the contents of which are incorporated by reference in their entirety.

TECHNICAL FIELD

The present disclosure relates to a super junction semiconductor device and a method of manufacturing the same, and more particularly, to a super junction semiconductor device including a metal oxide semiconductor field effect transistor (hereinafter, referred to as "MOSFET") and a method of manufacturing the super junction semiconductor device.

BACKGROUND

Generally, a super junction semiconductor device having a super junction structure has been widely used in order to improve a trade-off relation between forward characteristics and reverse characteristics in a power semiconductor device.

According to the prior art, the super junction semiconductor device includes a plurality of N-type pillars spaced apart from each other and a plurality of P-type pillars spaced apart from each other to be alternatively arranged, and a plurality of gate structures. Therefore, the super junction semiconductor device has a relatively low on-resistance $R_{sp}$ to improve switching characteristics.

In particular, when a side interface between the N-type pillars and the P-type pillars extends linearly along a vertical direction, the gate structures may take up a relatively small area to decrease an amount of gate charges Qg.

FIG. 1 is a graph showing switching characteristics of a conventional super junction semiconductor device.

Referring to FIG. 1, a conventional super junction semiconductor includes a sidewall defined by a boundary between the N-type pillar and the P-type. The sidewall extends in the vertical direction to define a linear sidewall.

A turn-on delay time $t_{d(on)}$ is the time from when the gate-source voltage $V_{GS}$ rises over 10% of the gate drive voltage to when the drain current rises past 10% of the specified current. At the moment of $t_{d(on)}$, VGS reaches up to the threshold voltage $V_{TH}$. A rise time $t_r$ is the time between the drain current rising from 10% to 90% of load current. A turn-off delay time $t_{d(off)}$ is the time from when the gate-source voltage $V_{GS}$ drops below 90% of the gate drive voltage to when the drain current drops below 90% of the load current. A fall time $(t_f)$ is the time between the drain current falling from 90% to 10% of load current.

As shown in FIG. 1, according to the conventional super junction semiconductor, a mirror capacitance $(C_{rss})$ may be further reduced during switching, which may cause oscillation to occur. In particular, when the drain source $V_{dd}$ and the current increase, the switching noise problem may become serious.

SUMMARY

The example embodiments of the present disclosure provide a super junction semiconductor device capable of increasing the mirror capacitance to suppress the oscillation from occurring.

The example embodiments of the present disclosure provide a method of manufacturing a super junction semiconductor device capable of increasing the mirror capacitance to suppress the oscillation from occurring.

According to an example embodiment of the present disclosure, a super junction semiconductor device includes a substrate having a first conductive type, a blocking layer positioned on the substrate, the blocking layer including first conductive type pillars and second conductive type pillars, each extending in a vertical direction and arranging alternatively in a horizontal direction, and a gate structure disposed on the blocking layer, the gate structure extending in the horizontal direction and being electrically connected to ones of the first and second conductive type pillars, wherein each pillars of either the first conductive type pillars or the second conductive type pillars includes a plurality of pillar cells stacked and overlapped in the vertical direction to be connected to each other, and each pillars has a maximum width $W_1$ and overlapping widths $W_2$ measured at an upper and a lower end portions thereof along the horizontal direction.

In an example embodiment, the each of the pillar cells has a spherical shape of a first diameter D1. Here, each of the overlapping widths is about 0.2 to about 0.8 times the first diameter D1.

In an example embodiment, the overlapping widths $W_2$ become smaller downwardly.

In an example embodiment, each of the second conductive type pillars has a bent sidewall being in contact with the first conductive type pillars adjacent to the second conductive type pillars.

In an example embodiment, the second conductive type pillars have shapes identical to corresponding ones of the first conductive type pillars that are arranged adjacent to each one of the second conductive type pillars.

In an example embodiment, the gate structure may include a gate insulating layer extending in the horizontal direction to cross the first and the second conductive type pillars alternatively, a gate electrode formed on the gate insulating layer, and an insulating interlayer surrounding the gate electrode.

In an example embodiment, P-body regions are formed at top portions of the second conductive type pillars.

According to an example embodiment of the present disclosure, a super junction semiconductor device is manufactured in several stages. A substrate of a first conductive type is prepared and then a blocking layer is formed on the substrate, the blocking layer including first conductive type pillars and second conductive type pillars each extending in a vertical direction (i.e., the direction away from the substrate) and arranging alternatively in a horizontal direction (i.e., the direction parallel with the substrate). A gate structure is formed on the blocking layer, the gate structure extending in the horizontal direction and being electrically connected to one of the first and second conductive type pillars, wherein each pillars of either the first conductive type pillars or the second conductive type pillars includes a plurality of pillar cells stacked and overlapped in the vertical direction to be connected to each other, and each pillars has a maximum width $W_1$ and overlapping widths $W_2$ measured at an upper and a lower end portions thereof along the horizontal direction.

In an example embodiment, the blocking layer may be formed by (a) forming a first epitaxial layer on the substrate, (b) partially removing the first epitaxial layer to form a trench, and (c) filling the trench to form a plurality of second pillar cells doped with second conductive type impurities to define a plurality of first pillar cells adjacent to the second pillar cells. In one such embodiment, the trench has a spherical shape. Alternatively, the trench has an overhang structure.

Further, (a) to (c) may be repeated. A second epitaxial layer formed on the first epitaxial layer and the first pillar cells may have a thickness smaller than that of the first epitaxial layer in some embodiments.

In an example embodiment, the blocking layer may be formed by (d) forming a first epitaxial layer on the substrate, (e) implanting second conductive type impurities into the first epitaxial layer to form a first pillar cell of the second conductive type in the first epitaxial layer, (f) forming a second epitaxial layer on the first epitaxial layer including the first pillar cells, and (g) implanting second conductive type impurities into the second epitaxial layer to form a second pillar cell of the second conductive type, connected with the first pillar cell.

In embodiments, the first epitaxial layer has a thickness larger than that of the second epitaxial layer.

In an example embodiment, (d) to (g) may be repeated.

In an example embodiment, the each of the pillar cells has a spherical shape of a first diameter D1.

In an example embodiment, each of the overlapping widths $W_2$ is about 0.2 to about 0.8 times the first diameter D1.

In an example embodiment, the overlapping widths $W_2$ become smaller downwardly.

According to example embodiments of the super junction semiconductor device and the method of manufacturing the super junction semiconductor device, the super junction semiconductor device may have an increased volume of the first conductivity type pillars. Thus, the amount of the charge Qgd between the gate and the drain electrodes may be increased. Therefore, a mirror capacitance value may also increase as the capacitance Cgd value increases. As a result, the super junction semiconductor device may improve switching characteristics by suppressing oscillation phenomena from occurring.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions, or plates may also be present. By contrast, it will also be understood that when a layer, a film, a region or a plate is referred to as being 'directly on' another one, it is directly on the other one, and one or more intervening layers, films, regions or plates do not exist. Also, though terms such as a first, a second, and a third are used to describe various components, compositions, regions, films, and layers in various embodiments of the present disclosure, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present disclosure. Accordingly, changes in the shapes of the diagrams, for example, changes in manufacturing techniques and/or allowable errors, are sufficiently expected. The Figures are not necessarily drawn to scale. Accordingly, embodiments of the present disclosure are not described as being limited to specific shapes of areas described with diagrams and include deviations in the shapes and also the areas described with drawings are entirely schematic and their shapes do not represent accurate shapes and also do not limit the scope of the present invention.

Figure 2:
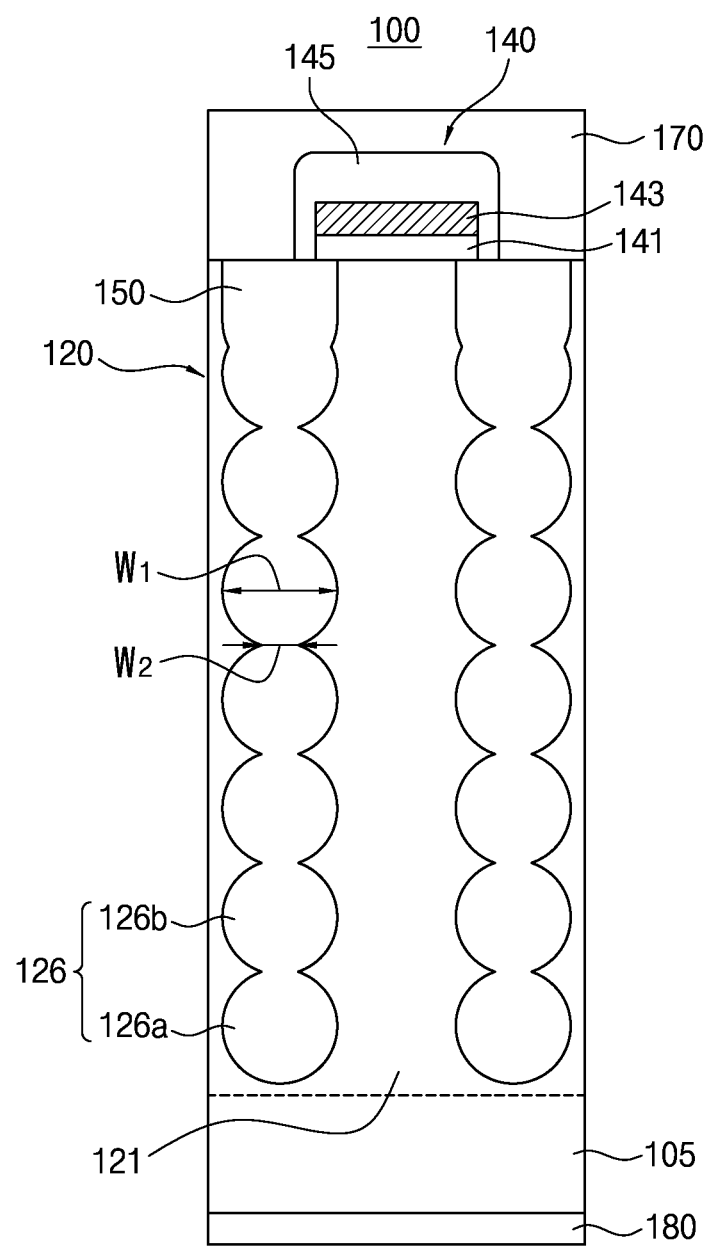
FIG. 2 is a cross sectional view illustrating a super junction semiconductor device in accordance with an example embodiment of the present disclosure.

FIG. 2 is a cross sectional view illustrating a super junction semiconductor device in accordance with an example embodiment of the present disclosure.

Referring to FIG. 2, a super junction semiconductor device 100 in accordance with an example embodiment of the present disclosure includes a substrate 105, a blocking layer 120 having a plurality of pillars 121 and 126, a gate structure 140, a source electrode 170 and a drain electrode 180.

The substrate 105 may include a silicon substrate and has a first conductive type, for example, a high concentration conductive $N^+$ type.

The blocking layer 120 is positioned on the substrate 105. The blocking layer 120 includes a plurality of first conductive type pillars 121 and a plurality of second conductive type pillars 126, each extending in a vertical direction ("vertical" herein refers to the orientation shown on the page). The first and the second conductive type pillars 121 and 126 are alternatively arranged in a horizontal direction, again referring to the orientation shown on the page for FIG. 2.

Each of the first conductive type pillars 121 has the first conductive type, for example, a low concentration n⁻ type conductivity. The first conductive type pillars 121 are formed on the substrate 105 by an epitaxial growth process.

The second conductive type pillars 126 are provided between the first conductive type pillars 121, each extending in the vertical direction. Each of the second conductive type pillars 126 has a second conductive type, for example, a p" type. The second conductive type pillars 126 are spaced apart from one another by a predetermined distance in the horizontal direction.

Each of the second conductive type pillars 126 includes a plurality of pillar cells 126a and 126b which are stacked in the vertical direction such that the pillar cells 126a and 126b are partially overlapped with each other to be entirely connected to each other. An upper portion of pillar cell 126a overlaps with a lower portion of pillar cell 126b. Likewise, the other pillar cells not specifically labeled partially overlap with other pillar cells positioned adjacent both in an upper direction and a lower direction with respect to the orientation of the page.

Each of the pillar cells 126a and 126b is provided to have a maximum width $W_1$ measured in the horizontal direction and an overlapping width $W_2$ measured in the horizontal direction.

Each of the pillar cells 126a and 126b has a spherical shape, in this example. Each of the filler cells 126a and 126b may have a diameter. Therefore, each of the pillar cells 126a and 126b may have overlapping widths $W_2$ at upper and lower portions thereof.

The gate structure 140 is located on the blocking layer 120. The gate structure 140 extends along the horizontal direction and has a stripe shape in the embodiment shown in FIG. 2. When a plurality of gate structures 140 is formed, the gate structures 140 are spaced apart from one another. The gate structure 140 shown in the cross-section of FIG. 2 is positioned to cross the first conductive type pillars 121 in a plan view.

Since the gate structure 140 has the stripe shape, the gate structure 140 has a relatively small area so that an input capacitance of the super junction semiconductor device 100 may be reduced compared to conventional devices.

In an example embodiment, the gate structure 140 includes a gate insulating layer 141, a gate electrode 143 and an insulating interlayer 145.

The gate insulating layer 141 is provided on the blocking layer 120 to cross the first conductive type pillars 121. The gate insulating layer 121 may include an oxide.

The gate electrode 143 is located on the gate insulating layer 141. A width of the gate electrode 143 may be narrower than that of the gate insulating layer 141, in embodiments. For example, the gate electrode 143 includes polysilicon.

The insulating interlayer 145 is disposed on the gate electrode 143 to surround the gate electrode 143. The insulating interlayer 145 electrically isolates the gate electrode 143 and the source electrode 170 from each other. The insulating interlayer 145 may include a nitride.

In an example embodiment, although not shown, the gate structure 140 may have a trench structure. In this case, the gate structure 140 is formed to extend inside of the blocking layer 120. When the gate structure 140 has the trench structure, an interval between the second conductive type pillars 126 may be reduced, and the super junction semiconductor device 100 may have improved forward characteristics by enhancing a degree of integration of the super junction semiconductor device 100.

The source electrode 170 is formed on the blocking layer 120 to cover the gate structure 140. The drain electrode 180 is formed on a lower face of the substrate 105.

In an example embodiment of the present disclosure, each of the overlapping widths $W_2$ is about 0.2 to about 0.8 times the size of the maximum widths $W_1$. In this case, the super junction semiconductor device 100 in accordance with an example embodiment of the present disclosure may have an increased volume of the first conductivity type pillars 121 as compared with the super junction semiconductor device having a linear interface between the first and second conductivity type pillars. Thus, the amount of the charge $Q_{gd}$ between the gate and the drain electrodes may be increased. Therefore, a mirror capacitance value may also increase as the capacitance $C_{gd}$ value increases. As a result, the super junction semiconductor device 100 may improve switching characteristics by suppressing oscillation phenomena from occurring.

In an example embodiment of the super junction semiconductor device 100, each of the second conductive type pillars 126 may have a polygonal shape in a plan view such as a pentagonal shape and a hexagonal shape. The second conductive type pillars 126 are arranged to be spaced apart from each other. When the second conductive type pillars 126 are arranged to have a hexagonal shape, a horizontal area of the second conductive type pillars 126 is reduced, whereas the horizontal area of the first conductive type pillars 121 is increased. Therefore, an on-resistance of the super junction semiconductor device 100 may be reduced due to the increased area of the first conductive type pillars 121.

In an example embodiment of the present disclosure, each of the second conductive type pillars 126 has a bent sidewall being in contact with the first conductive type pillars adjacent to the second conductive type pillars.

In an embodiment of the present disclosure, the second conductive type pillars 126 may have a shape same as each other with respect to one of the first conductive pillars 121.

Figure 3:
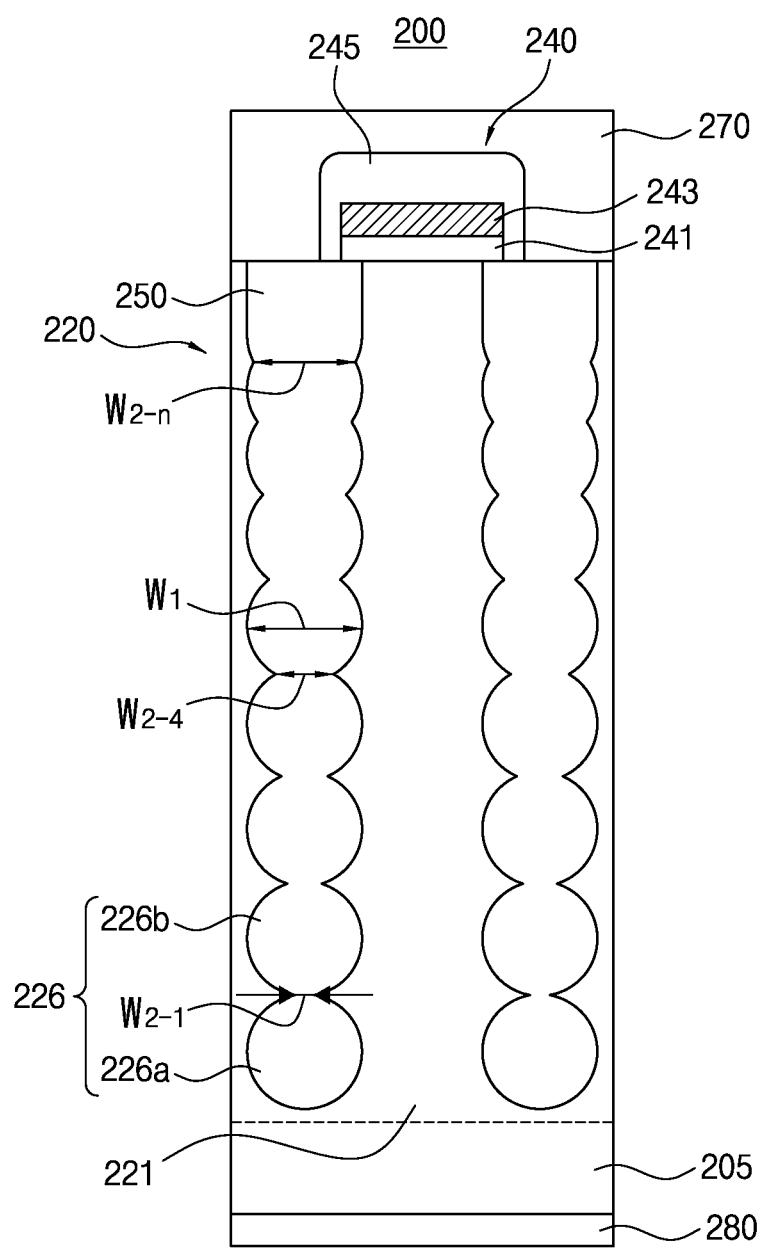
FIG. 3 is a cross sectional view illustrating a super junction semiconductor device in accordance with an example embodiment of the present disclosure.

FIG. 3 is a cross sectional view illustrating a super junction semiconductor device in accordance with an example embodiment of the present disclosure.

Referring to FIG. 3, a super junction semiconductor device 200 in accordance with an example embodiment of the present disclosure includes a substrate 205, a blocking layer 220 having a plurality of pillars 221 and 226 with opposite conductivity types as described above with respect to FIG. 2, a gate structure 240, a source electrode 270 and a drain electrode 280.

Figure 1:
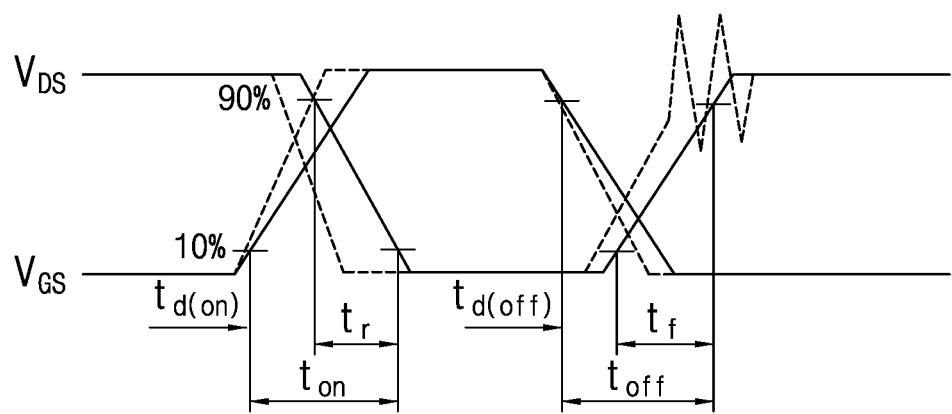
FIG. 1 is a graph showing switching characteristics of a conventional super junction semiconductor device.

The substrate 205, the gate structure 240, the source electrode 270, and the drain electrode 280 are substantially the same as those of the super junction semiconductor device 100 described above with reference to FIG. 1 with reference numbers iterated by a factor of 100, and therefore a detailed description thereof will be omitted in order to avoid redundancy.

The blocking layer 220 is positioned on the substrate 205. The blocking layer 220 includes a plurality of first conductive type pillars 221 and a plurality of second conductive type pillars 226, each extending in a vertical direction. The first and the second conductive type pillars 221 and 226 are alternatively arranged in a horizontal direction.

Each of the first conductive type pillars 221 has the first conductive type, for example, a low concentration conductive n⁻ type. The first conductive type pillars 221 are formed on the substrate 205 by an epitaxial growth process.

The second conductive type pillars 226 are provided between the first conductive type pillars 221 and each extend in the vertical direction. Each of the second conductive type pillars 226 has a second conductive type, for example, a p⁻ type. The second conductive type pillars 226 are spaced apart from one another by a predetermined distance in the horizontal direction.

Each of the second conductive type pillars 226 includes a plurality of pillar cells 226a and 226b which are stacked in the vertical direction such that the pillar cells 226a, 226b . . . and 226n are partially overlapped with each other to be entirely electrically connected to each other. Both an upper portion and a lower portion of each pillar cells 226a, 226b . . . and 226n are partially overlapped with other pillar cells positioned adjacent both in an upper direction and a lower direction.

Each of the pillar cells 226a, 226b . . . and 226n has a maximum width $W_1$ measured in the horizontal direction and an overlapping width $W_2$ measured in the horizontal direction.

Each of the pillar cells 226a, 226b . . . and 226n has a spherical shape, in this example. In FIG. 3, each of the filler cells 226a, 226b . . . and 226n may have a diameter. Therefore, each of the pillar cells 226a, 226b . . . and 226n stacked on each other may have overlapping widths $W_{2-1}$, $W_{2-2}$ and $W_{2-n}$ of a predetermined size at each upper and lower portions thereof.

In an example embodiment, each of the overlap widths $W_{2-1}$, $W_{2-2}$ . . . and $W_{2-n}$ may have a value that decreases downwardly. As a result, an area of the first conductivity type pillars 221 may relatedly increase.

The super junction semiconductor device 100 in accordance with an example embodiment of the present disclosure may have an increased volume of the first conductive type pillars 221 as compared with the super junction semiconductor device having a linear interface between the first and second conductive type pillars. Thus, the amount of the charge $Q_{gd}$ between the gate and the drain electrodes may be increased. Therefore, a mirror capacitance value may also increase as the capacitance $C_{gd}$ value increases. As a result, the super junction semiconductor device 100 may improve switching characteristics by suppressing oscillation phenomena from occurring.

Figure 4:
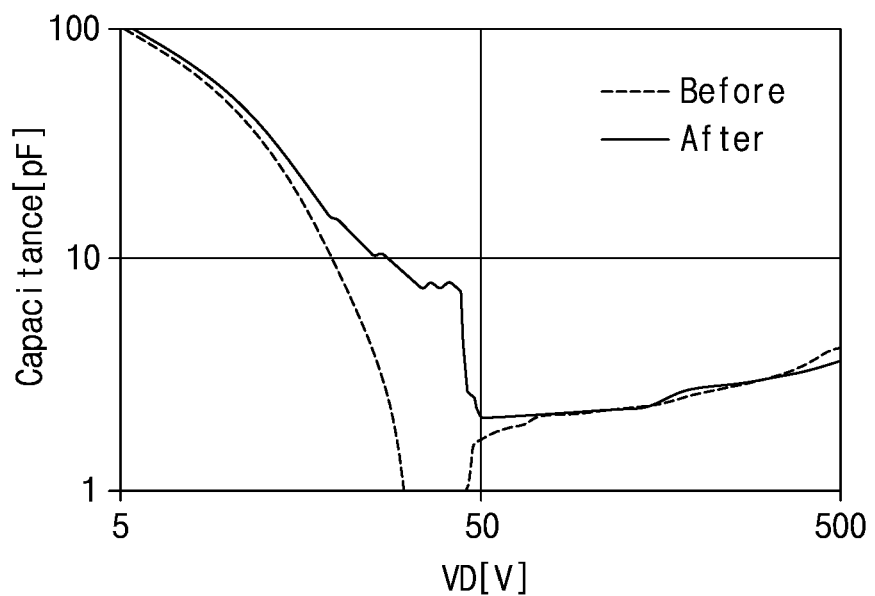
FIG. 4 is a graph showing capacitance values between a gate electrode and a drain electrode with varying voltages of a super junction semiconductor device in accordance with an example embodiment of the present disclosure.
Figure 5:
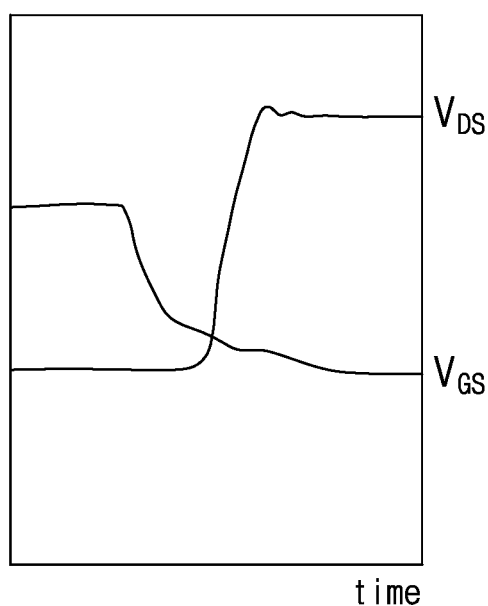
FIG. 5 is a graph showing switching characteristics of a super junction semiconductor device in accordance with an example embodiment of the present disclosure.

FIG. 4 is a graph showing capacitance values between gate and drain with varying voltages of a super junction semiconductor device in accordance with an example embodiment of the present disclosure. FIG. 5 is a graph showing switching characteristics of a super junction semiconductor device in accordance with an example embodiment of the present disclosure;

Referring to FIGS. 4 and 5, a capacitance value (shown in solid line) between the gate and drain electrodes with varying a voltage value of a super junction semiconductor device is in a range below 60 V about 2 to 10 times higher than a capacitance value (shown by the dotted line) between the gate and drain electrodes of the super junction semiconductor device having a linear interface between the first and the second conductive type pillars.

Furthermore, in the switching characteristics of the super junction semiconductor according to some example embodiments of the present disclosure, the mirror capacitance $C_{rss}$ may be also reduced due to the decrease of the gate-drain capacitance value, thereby suppressing oscillation phenomenon from occurring while switching.

FIGS. 6 to 10 are cross sectional views illustrating a method of manufacturing a super junction semiconductor device in accordance with an example embodiment of the present invention.

Figure 6:
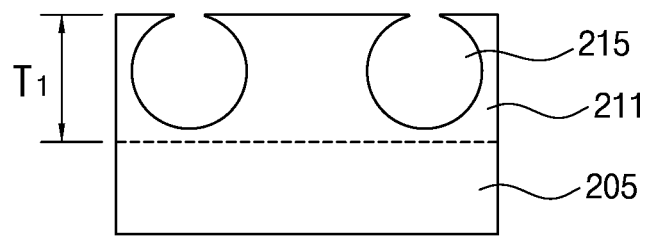
FIGS. 6 to 10 are cross sectional views illustrating a method of manufacturing a super junction semiconductor device in accordance with an example embodiment of the present disclosure.

Referring to FIG. 6, a first epitaxial layer 211a of a first conductive type, for example, a low concentration n type is formed on a substrate 205 of the first conductive type, for example, a high concentration n⁺ type. The first epitaxial layer 211 may be formed by performing an epitaxial growth process against the substrate 205. The first epitaxial layer 211 may have a first thickness T1.

After a first mask pattern (not shown) is formed on an upper face of the first epitaxial layer 211, an etching process using a first mask pattern as an etching mask is performed to form first trenches 215 in the first epitaxial layer 211. The first mask pattern may be formed using photoresist. The etching process may include an isotropic etching process using an etchant.

The first trenches 215 are spaced apart from one other by a predetermined distance in a horizontal direction. For example, each of the first trenches 215 has a spherical shape. Alternatively, each of the first trenches 215 may have an overhang structure.

The first mask pattern can be removed after forming the first trenches 215.

Figure 7:
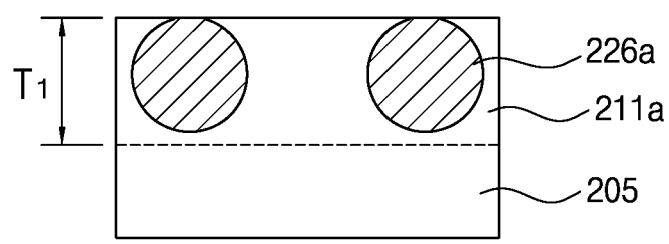

Referring to FIG. 7, after removing the first mask pattern from the first epitaxial layer 211a having the first trenches 215, additional epitaxial growth process and a planarizing process are further performed to fill the first trenches 215. Thus, first pillar cells 226a are formed in the first trenches 215 with filling the first trenches 215.

Each of the first pillar cells 226 has a second conductive type, for example p-type conductivity.

In detail, the first pillar cells 226a are grown with a second conductivity type, for example, p-type impurities, to fill the first trenches 215. The first pillar cells 226a may extend in a vertical direction inside the first epitaxial layer 211a. In addition, the first pillar cells 226a may have a shape corresponding to the first trenches 215. Further, the first pillar cells 226a are spaced apart from each other by a predetermined interval in a horizontal direction.

Figure 8:
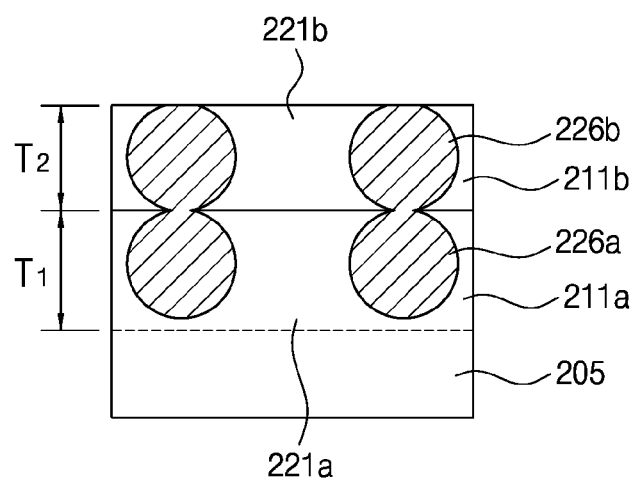

Referring to FIG. 8, a second epitaxial layer 211b of a first conductive type, for example, a low concentration n-type conductivity, is formed on the first epitaxial layer 211a. The second epitaxial layer 211b may be formed by an epitaxial growth process. The second epitaxial layer 211b may have a second thickness T2. The second thickness T2 may be smaller than the first thickness T1.

Subsequently, a second mask pattern (not shown) is formed on an upper surface of the second epitaxial layer 211b, and an etching process using the second mask pattern as an etching mask is performed. As a result, second trenches (not shown) are formed in the second epitaxial layer 211b. The second trenches may partially expose the second filler cells 226a. The etching process may include an isotropic etching process using an etchant.

After removing the second mask pattern, an epitaxial process and a planarization process are performed against the second epitaxial layer 211b including the second trenches. As a result, the second pillar cells 226b of the second conductive type are formed by filling the second trenches.

The epitaxial growth is performed to form the second filler cells 226b of a second conductivity type grow with, for example, p-type impurities, thereby filling the second trenches. The second pillar cells 226b may extend in the vertical direction inside the second epitaxial layer 211b. In addition, the second pillar cells 226b may have a shape corresponding to the second trenches. Further, the second filler cells 226b are spaced apart from each other by a predetermined interval in the horizontal direction.

Meanwhile, the first and second filler cells 226a and 226b are partially overlapped with each other and are stacked along the vertical direction. Thus, the first and second pillar cells 226a and 226b may be entirely connected. Therefore, the first and second filler cells 226a and 226b are provided to have an overlapping width W in the horizontal direction.

Figure 9:
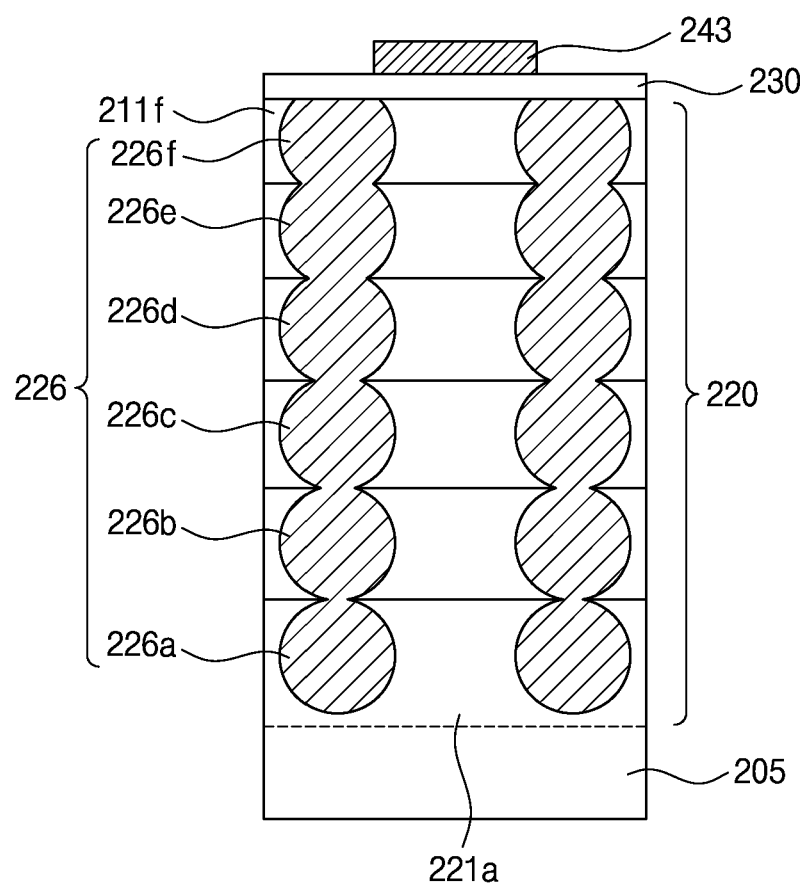

Referring to FIG. 9, as the process of forming an epitaxial layer, trenches and pillar cells are sequentially performed several times, a plurality of pillar cells are stacked in the vertical direction to form second conductive type pillars 226. Meanwhile, first conductive pillars 221 are formed between the second conductive pillars 226 adjacent to each other. As a result, the blocking layer 220 including the first conductive pillars 221 and the second conductive pillars 226 is formed.

A preliminary gate insulating layer 230 is formed on a sixth epitaxial layer 211f (located at the highest position) included in the blocking layer 220, and a polysilicon layer (not shown) for forming a gate electrode is formed on the preliminary gate insulating layer 230. The preliminary gate insulating layer 230 may be formed using an oxide.

Thereafter, the polysilicon layer is patterned through a photolithography process to form gate electrodes 243. Each of the gate electrodes 243 has a stripe shape extending in one direction.

For example, each of the gate electrodes 243 may be positioned to cross between the second conductive type pillars 226.

Figure 10:
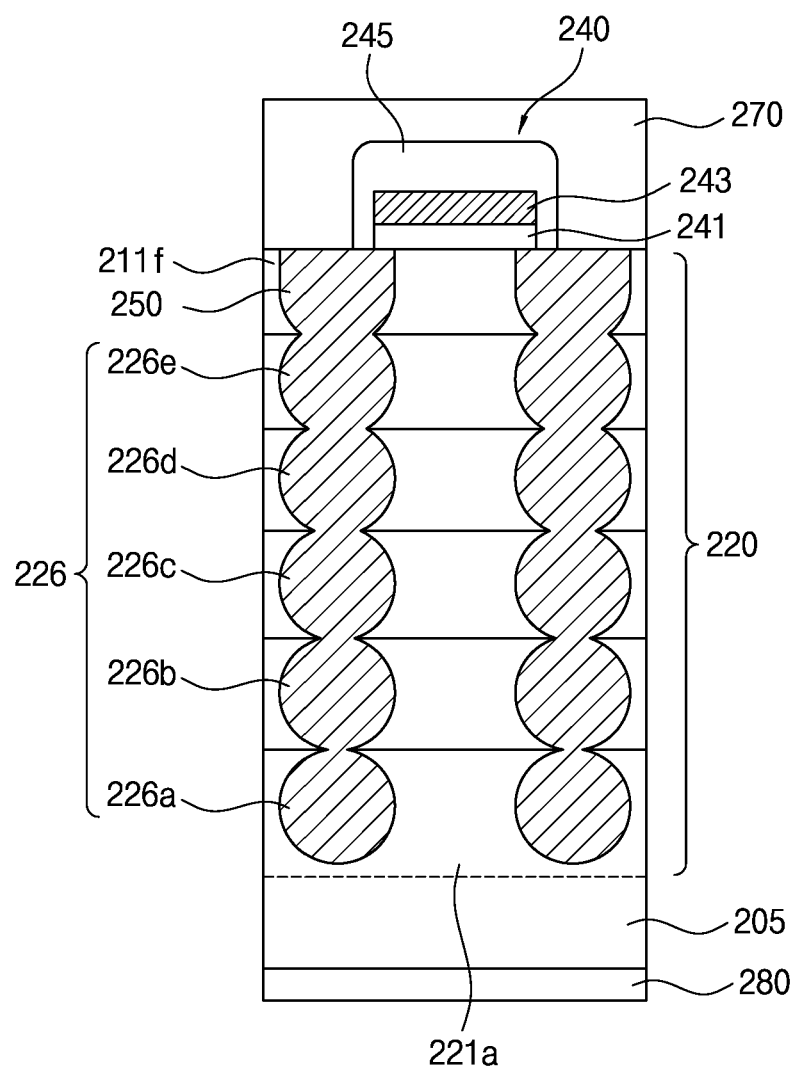

Referring to FIG. 10, p-body regions 250 may be formed by implanting second conductive type impurities, for example, p-type impurities into upper portions of the second conductive type pillars 226 using the gate electrodes 243 as masks.

Since the second conductive type pillars 226 are positioned between the gate electrodes, the p-body region 250 may be formed in each of upper portions of the second conductive type pillars 230, respectively.

A preliminary insulating interlayer (not shown) covering the gate electrodes 243 and exposed portions of the preliminary gate insulating layer 230 is formed. An example of the preliminary insulating interlayer may be a nitride.

Thereafter, the preliminary insulating interlayer and the preliminary gate insulating layer 230 are partially etched through a photolithography process to form the insulating interlayer 245 and the gate insulating layer 241. Accordingly, the gate structure 240 including the gate insulating layer 241, the gate electrode 243 and the insulating interlayer 245 may be formed.

The source electrode 270 is formed by forming a metal layer to cover the gate structures 240. In addition, a drain electrode 280 is formed by forming a metal layer on a lower surface of the substrate 205.

Figure 11:
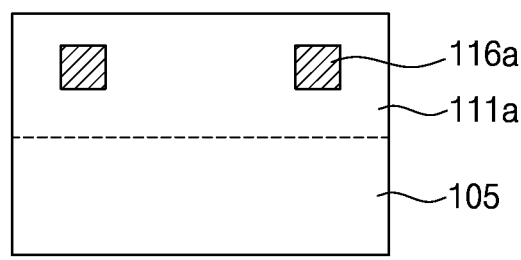
FIGS. 11 to 13 are cross sectional views illustrating the formation of a blocking layer in accordance with another example embodiment of the present disclosure.
Figure 12:
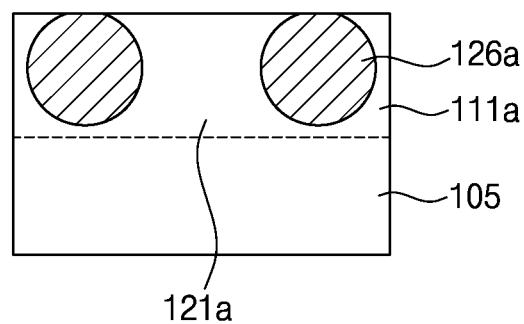
Figure 13:
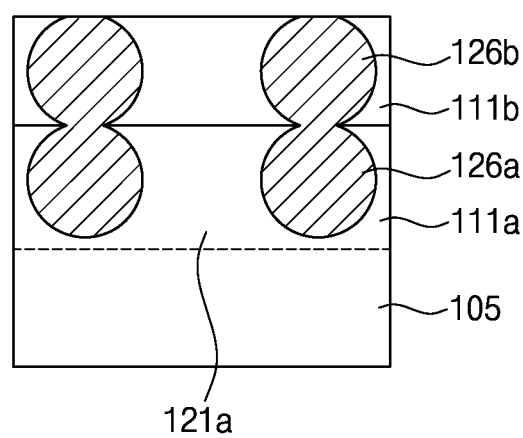

FIGS. 11 to 13 are cross sectional views illustrating a step of forming a blocking layer in accordance with another example embodiment of the present disclosure.

Referring to FIG. 11, a first epitaxial layer 111a of a first conductivity type, for example, a low concentration n-type conductivity, is formed on a substrate 105 of a first conductivity type, for example, a high concentration n+ type. The first epitaxial layer 111a may be formed by an epitaxial growth process.

Subsequently, a first mask pattern (not shown) is formed on the upper surface of the first epitaxial layer 111a, and then an ion implantation process using the first mask pattern as an ion implantation mask is performed. As a result, first preliminary pillar cells 116a of a second conductive type are formed in the first epitaxial layer 111a.

The first preliminary pillar cells 116a are spaced apart from each other by a predetermined interval in the horizontal direction.

Referring to FIG. 12, after removing the first mask pattern, a heat treatment process is performed against the first preliminary pillar cells 116a. Impurity ions of the first preliminary pillar cells 116a are diffused to form first pillar cells 126a in the first epitaxial layer 111a. The temperature and time of the heat treatment process may be adjusted according to desired size and shape of the first pillars 126a.

Next, a second epitaxial layer 111b of a first conductive type, for example, a low concentration n-type conductivity, is formed. The second epitaxial layer 111b may be formed by an epitaxial growth process.

Subsequently, a second mask pattern (not shown) is formed on an upper surface of the second epitaxial layer 111b and an ion implantation process using the second mask pattern as an ion implantation mask is performed. As a result, second preliminary pillar cells (not shown) are formed in the second epitaxial layer 111b.

In this case, the second preliminary pillar cells are spaced apart from each other by a predetermined interval in the horizontal direction.

After removing the second mask pattern, a heat treatment process is performed against the second preliminary pillar cells. In this case, impurity ions of the second preliminary pillar cells are diffused to form second pillar cells 126b in the second epitaxial layer 111b.

As the process of forming the epitaxial layer and the pillar cells is performed several times, second conductive pillars including a plurality of pillar cells stacked in the vertical direction are formed. Meanwhile, first conductive pillars are formed between adjacent second conductive pillars. As a result, a blocking layer including the first conductive pillars and the second conductive pillars is formed.

According to the super junction semiconductor device and the manufacturing method thereof, the amount of charge $Q_{gd}$ between the gate and the drain may be increased as the volume of the first conductive type fillers is relatively increased. As a result, the mirror capacitance value may also increase as the capacitance $C_{gd}$ value increases. Therefore, the super junction semiconductor device 100 may improve switching characteristics by suppressing oscillation from occurring.

Since the input capacitance value may be reduced while reducing the on-resistance of the super junction semiconductor device, the super junction semiconductor device may have improved performance.

Although the super junction semiconductor device has been described with reference to the specific embodiments, they are not limited thereto. Therefore, it will be readily understood by those skilled in the art that various modifications and changes can be made thereto without departing from the spirit and scope of the appended claims.

The invention claimed is:

1. A super junction semiconductor device comprising:
   a substrate having a first conductive type;
   a blocking layer positioned on the substrate, the blocking layer including first conductive type pillars and second conductive type pillars, each extending in a vertical direction and arranged alternatively in a horizontal direction with respect to one another; and a gate structure disposed on the blocking layer, the gate structure extending in the horizontal direction and electrically connected to ones of the first and second conductive type pillars, wherein each pillar of ones of the first conductive type pillars and the second conductive type pillars includes a corresponding plurality of pillar cells stacked and overlapped with one another in the vertical direction such that the plurality of pillar cells of each pillar are electrically interconnected with one another, and each pillar cell has both a maximum width and overlapping widths along the horizontal direction, wherein each of the second pillar cells has a spherical shape having a first diameter, and wherein the overlapping width of each of the second conductive type cells is smaller than that of the second conductive type pillar cell above it.

2. The super junction semiconductor device of claim 1, wherein each of the overlapping widths is in a range of 0.2 to 0.8 times the first diameter.

3. The super junction semiconductor device of claim 1, wherein each of the second conductive type pillars has a bent sidewall arranged in contact with the first conductive type pillars adjacent to the second conductive type pillars.

4. The super junction semiconductor device of claim 1, wherein the second conductive type pillars have shapes identical to each other with respect to one of the first conductive type pillars adjacent to the second conductive type pillars.

5. The super junction semiconductor device of claim 1, wherein the gate structure includes:
a gate insulating layer extending in the horizontal direction to cross the first and the second conductive type pillars alternatively;
a gate electrode formed on the gate insulating layer; and
an insulating interlayer surrounding the gate electrode.

6. The super junction semiconductor device of claim 1, further comprising p-body regions formed at top portions of the second conductive type pillars.

7. A product made by the process of:
preparing a substrate of a first conductive type;
forming a blocking layer on the substrate, the blocking layer including first conductive type pillars and second conductive type pillars each extending in a vertical direction and arranged alternatively in a horizontal direction; and
forming a gate structure on the blocking layer, the gate structure extending in the horizontal direction and being electrically connected to one of the first and second conductive type pillars,
wherein each pillar of ones of the first conductive type pillars and the second conductive type pillars includes a corresponding plurality of pillar cells stacked and overlapped in the vertical direction and electrically interconnected to the other pillar cells of the same pillar, and wherein each pillar has a maximum width and an overlapping widths along the horizontal direction,
wherein forming the blocking layer comprises:
(a) forming a first epitaxial layer on the substrate;
(b) partially removing the first epitaxial layer to form a trench; and
(c) filling the trench to form a plurality of second pillar cells doped with second conductive type impurities to define a plurality of first pillar cells adjacent to the second pillar cells, and
(d) repeating (a) to (c),
wherein a second epitaxial layer formed on the first epitaxial layer and the first pillar cells has a thickness lower than that of the first epitaxial layer.

8. The product made by the process of claim 7, wherein the trench has a spherical shape.

9. The product made by the process of claim 7, wherein the trench has an overhang structure.

10. The product made by the process of claim 7, wherein the each of the pillar cells has a spherical shape and defines a first diameter.

11. The product made by the process of claim 10, wherein each of the overlapping widths is 0.2 to 0.8 times the first diameter D1.

12. The product made by the process of claim 7, wherein the overlapping width of any given pillar cell is smaller than the overlapping width of the pillar cell above it.

13. A product made by the process of:
preparing a substrate of a first conductive type;
forming a blocking layer on the substrate, the blocking layer including first conductive type pillars and second conductive type pillars each extending in a vertical direction and arranged alternatively in a horizontal direction; and
forming a gate structure on the blocking layer, the gate structure extending in the horizontal direction and being electrically connected to one of the first and second conductive type pillars,
wherein each pillar of ones of the first conductive type pillars and the second conductive type pillars includes a corresponding plurality of pillar cells stacked and overlapped in the vertical direction and electrically interconnected to the other pillar cells of the same pillar, and wherein each pillar has a maximum width and an overlapping widths along the horizontal direction,
wherein forming the blocking layer comprises:
(a) forming a first epitaxial layer on the substrate;
(b) implanting second conductive type impurities into the first epitaxial layer to form a first pillar cell of the second conductive type in the first epitaxial layer;
(c) forming a second epitaxial layer on the first epitaxial layer including the first pillar cells; and
(d) implanting second conductive type impurities into the second epitaxial layer to form a second pillar cell of the second conductive type, being connected with the first pillar cell, wherein the first epitaxial layer has a thickness larger than that of the second epitaxial layer.

14. The product made by the process of claim 13, further comprising repeating (a) to (d).

* * * * *